United States Patent [19]

Koga

[11] Patent Number: 4,573,022
[45] Date of Patent: Feb. 25, 1986

[54] SEMICONDUCTOR INTEGRATED CIRCUIT USING VERTICAL PNP TRANSISTORS

[75] Inventor: Takashi Koga, Fukaya, Japan

[73] Assignee: Kabushiki Kaisha Toshiba, Kawasaki, Japan

[21] Appl. No.: 681,142

[22] Filed: Dec. 13, 1984

[30] Foreign Application Priority Data

Dec. 17, 1983 [JP] Japan .................... 58-238669
Dec. 17, 1983 [JP] Japan .................... 58-238670

[51] Int. Cl.$^4$ .................... H03F 3/14; H03F 3/45
[52] U.S. Cl. .................... 330/307; 330/261
[58] Field of Search .................... 330/252, 261, 307, 273

[56] References Cited

U.S. PATENT DOCUMENTS 4,456,887 6/1984 Tokumo .................... 330/252

Primary Examiner—James B. Mullins
Assistant Examiner—G. Wan
Attorney, Agent, or Firm—Cushman, Darby & Cushman

[57] ABSTRACT

A semiconductor integrated circuit comprises a differential pair of transistors, a pair of constant current source transistors, an emitter resistor connected between the emitters of the differential transistors, and a load resistor coupled to the collector of one of the differential transistors. Each of the differential transistors and constant current source transistors is a vertical PNP transistor. In the semiconductor integrated circuit, therefore, each vertical PNP transistor has its collector coupled with a parasitic diode having a relatively large junction capacitance. The parasitic diodes are reversely biased when the circuit is operative. In order to prevent the frequency characteristic from being deteriorated due to the junction capacitance of the parasitic diodes, a resistor circuit, which forms a differentiating circuit together with the emitter resistor and the parasitic diodes, is connected between the cathodes of these diodes and a power source, whereby the differentiating time constant of this differentiating circuit is so adjusted as to become substantially equal to the integrating time constant of an integrating circuit including the load resistor and the parasitic diode.

13 Claims, 7 Drawing Figures

SEMICONDUCTOR INTEGRATED CIRCUIT USING VERTICAL PNP TRANSISTORS

BACKGROUND OF THE INVENTION

The present invention relates to a semiconductor integrated circuit and, more particularly, to a semiconductor integrated circuit which uses vertical PNP transistors.

Generally, in a bi-polar integrated circuit, NPN transistors are used. For this reason, a p type silicon substrate is used. In designing a circuit, however, it often becomes necessary to use PNP transistors. To form such PNP transistor on a p type silicon substrate, various types of PNP transistor can be adopted. In recent years, vertical PNP transistors, which have such a structure as shown in FIG. 1A, have been widely adopted. In order to form this type of PNP transistor, an n+ type buried layer serving as a local n type silicon substrate is formed on the p type silicon substrate. On his buried layer, a collector region (p conductivity type), base region (n conductivity type) and emitter region (p conductivity type) are formed in this order as shown in FIG. 1A.

In the vertical PNP transistor, a parasitic diode is formed between the p+ type region, which forms the collector, and the n type substrate (n+ type buried layer), which forms a junction together therewith. In order to reversely bias this parasitic diode, the n type substrate is connected to a power source. Since both the P+ type region and the n type substrate have high density impurity, and thus the depletion region is very narrow, the parasitic diode has a large junction capacitance.

With output impedance of the collector of the vertical PNP transistor, there arises no problem in the d.c. sense because the parasitic diode is rendered nonconductive. In the a.c. sense, however, a problem arises in that, as the frequency of the input signal increases, the output impedance decreases because the parasitic diode is large in junction capacitance. When the vertical PNP transistor is used as an amplifying transistor, a junction capacitance is connected in parallel with a load resistor between the collector of the transistor and ground. For this reason, as the frequency of an input signal increases, the load impedance decreases. Consequently, the frequency characteristic of amplifier gain is remarkably deteriorated. In other words, a frequency region which has a flat characteristic becomes narrow.

In the case, as well, where a differential amplifier circuit is constituted by vertical PNP transistors, its frequency characteristic is affected by parasitic diodes. In the differential amplifier circuit, a pair of differential transistors each consisting of vertical PNP transistor and a pair of constant current source transistors each consisting of vertical PNP transistor are used, resulting in a complicated circuit construction. Therefore, parasitic diodes greatly affect the frequency characteristic of the differential circuit. That is, a ripple occurs in the frequency characteristic. The ripple in the frequency characteristic will cause a waveform distortion such as ringing in the output of the circuit. The ripple in the frequency characteristic is attributable to an integrating time constant associated with a parasitic diode connected to a load as well as to a differentiating time constant associated with a parasitic diode connected to a constant current transistor. The integrating time constant acts to cause a decrease in the gain, while the differentiating time constant acts to cause an increase in the gain.

SUMMARY OF THE INVENTION

An object of the present invention is to provide a semicondutor integrated circuit which uses a vertical PNP transistor to which a parasitic diode having a relatively large junction capacitance is coupled, and which is improved in respect to its frequency characteristic.

Another object of the present invention is to provide a differential amplifier integrated circuit which has differential transistors and constant current source transistors, each transistor consisting of a vertical PNP transistor to which is coupled a parasitic diode having a relatively large junction capacitance, and which is so constructed that its frequency characteristic may be prevented from deteriorating due to the junction capacitance of the parasitic diode.

Basically, the integrated circuit of the present invention includes an amplifying transistor and a constant current source transistor each consisting of a vertical PNP transistor and having their emitter-collector paths connected in series across a power source in the forward direction. A load resistor is connected to the collector of the amplifying transistor. A parasitic diode which has a relatively large junction capacitance is coupled to each vertical PNP transistor such that its anode is connected to the collector of the transistor. The parasitic diode has its cathode connected to the power source so as to be reversely biased. In order to prevent the frequency characteristic of the integrated circuit from deteriorating due to the junction capacitance of the parasitic diode, a resistor circuit is connected between the cathode of the parasitic diode, connected to the collector of the constant current source transistor, and the power source. This resistor circuit forms a differentiating circuit together with the junction capacitance of the parasitic diode. The differentiating time constant of this differentiating circuit is so adjusted as to be substantially equal to the integrating time constant of an integrating circuit which includes the load resistor and the parasitic diode coupled to the collector of the amplifying transistor.

A differential amplifier circuit includes a pair of differential amplifying transistors and a pair of constant current source transistors to adjust the differentiating time constant of a differentiating circuit, which is formed by an emitter resistor connected between the emitters of the differential transistors and parasitic diodes coupled to the collectors of the constant current source transistors, so as to become substantially equal to the integrating time constant of an integrating circuit, which is formed by a load resistor and a parasitic diode coupled to the collector of one of the differential transistors. A resistor circuit is connected between the cathodes of the parasitic diodes, coupled to the collectors of the constant current source transistors, and the power source. Thus, the effects of the differentiating time constant and integrating time constant upon the frequency characteristic of the differential amplifier circuit are offset, with the result that a flat frequency characteristic is obtained.

The present invention can also be applied to an integrated circuit which includes a single vertical amplifying PNP transistor having its collector connected to a load resistor. This load resistor forms an integrating circuit together with a parasitic diode coupled to the collector of the amplifying transistor, and this integrating circuit acts to lower the frequency characteristic of the integrated circuit in a high-frequency range. According to the present invention, between the cathode of the parasitic diode and the power source is connected a direct-current transmission element such as a resistor which has an impedance higher than that of the load resistor. As a result, the junction capacitance of the parasitic diode becomes ignorable, with the result that the frequency characteristic is improved.

DETAILED DESCRIPTION OF THE PREFERRED EMBODIMENT

Figure 1A:
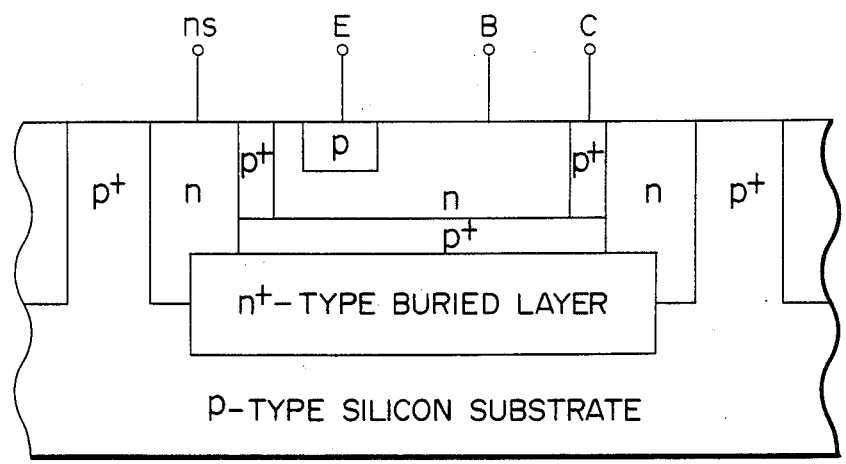
FIG. 1A shows a structure of a vertical PNP transistor used in integrated circuits.
Figure 1B:
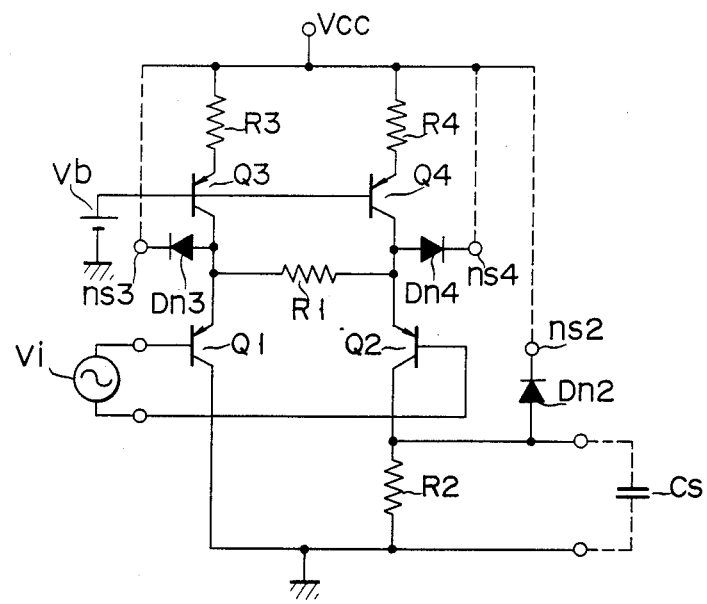
FIG. 1B shows a prior art differential amplifier integrated circuit which uses vertical PNP transistors.

For better understanding of the present invention, a prior art differential amplifier integrated circuit using vertical PNP transistors is described in connection with FIG. 1B. In the Figure, vertical PNP transistors Q1 and Q2 (differential transistors), emitter resistor R1, and load resistor R2 constitute a differential amplifying section of the integrated circuit. On the other hand, vertical PNP transistors Q3 and Q4, emitter resistors R3 and R4, and direct current source Vb constitute a constant current source section. A differential input signal from an input signal source Vi is applied to the bases of the differential transistors Q1 and Q2. An output signal is drawn out from the collector of the transistor Q2. In this differential amplifier integrated circuit, parasitic diodes Dn2 to Dn4 are respectively formed between the collectors (p type regions) of the transistors Q2 to Q4 and the n type substrates (n+ type buried layer) ns2 to ns4. The cathodes (n type substrate) of the parasitic diodes Dn2 to Dn4 are usually connected, for junction separation, to a direct-current power source Vcc, whereby these diodes are reversely biased. Practically, a parasitic diode is formed on the collector side of the transistor Q1. However, since this collector is grounded and thus the diode has no effect upon the frequency characteristic of the integrated circuit, the illustration thereof is omitted.

Figure 2:
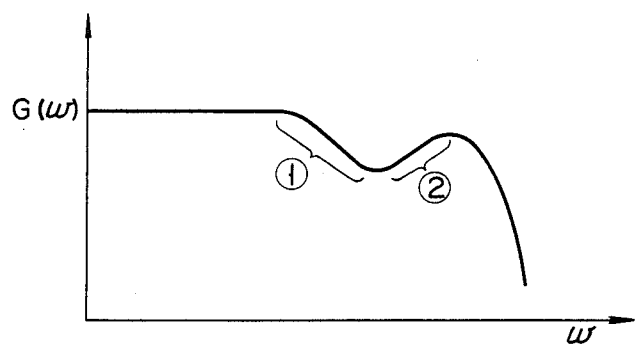
FIG. 2 shows a frequency characteristic of the circuit shown in FIG. 1B.

In the above-mentioned differential amplifier integrated circuit, the parasitic diodes Dn2 to Dn4 each have a large junction capacitance and, as a result, the circuit fails to have a desired frequency characteristic. An example of the frequency characteristic is shown in FIG. 2. In FIG. 2, a decrease in the gain in a region ① is due to an integrating time constant which is determined from the resistance value of the load resistor R2, junction capacitance of the parasitic diode Dn2, and input capacitance Cs of the succeeding stage. On the other hand, an increase in the gain in a region ② is due to a differentiating time constant which is determined from the resistance value of the emitter resistor R1 and the respective junction capacitances of the parasitic diodes Dn3 and Dn4. It will be understood from this that, as stated before, a ripple phenomenon occurs in the frequency characteristic due to the junction capacitances of the parasitic diodes. The ripple in the frequency characteristic causes the distortion such as ringing in the output waveform of the differential amplifier integrated circuit.

Hereinafter, a differential amplifier integrated circuit of the present invention will be described in connection with FIG. 3. In the Figure, transistors Q11 to Q14 consist of vertical PNP transistors, respectively. The transistors Q11 and Q12 serving as differential transistors have their emitters connected to each other by a resistor R11. The collector of the transistor Q11 is grounded while the collector of the transistor Q12 is grounded via a load resistor R12. The transistors Q13 and Q14 serving as constant current source transistors have their collectors connected to the emitters of the transistors Q11 and Q12, respectively, have their emitters connected to a direct current power source Vcc via resistors R13 and R14, respectively, and have their bases connected together to a direct current voltage source Vb.

The above differential amplifier integrated circuit is the same, in construction, as the prior art differential amplifier integrated circuit. According to the present invention, the cathodes of parasitic diodes Dn13 and Dn14 coupled to the collectors of the transistors Q13 and Q14, i.e., n type substrates ns13 and ns14, respectively, are connected to each other by series-connected resistors R15 and R16. A point of connection between these resistors R15 and R16 is connected to the power source Vcc via a resistor R17.

On the emitter side of the transistors Q11 and Q12, a differentiating circuit is formed by the parasitic diodes Dn13 and Dn14, resistors R15 and R16 and the emitter resistor R11. Its differentiating time constant is adjustable, or made variable, by varying the resistance values of the resistors R11, R15 and R16. On the other hand, an integrating circuit is formed by the load resistor R12 connected to the collector of the transistor Q12, the parasitic diode Dn12, and the succeeding stage input capacitance Cs.

Assume now that the diodes Dn12, Dn13 and Dn14 have an equal junction capacitance of Cj and the resistors R15 and R16 have an equal resistance value of Ra, and that, further, the resistor R17 has a resistance value which is sufficiently greater than the resistance value Ra.

Figure 3:
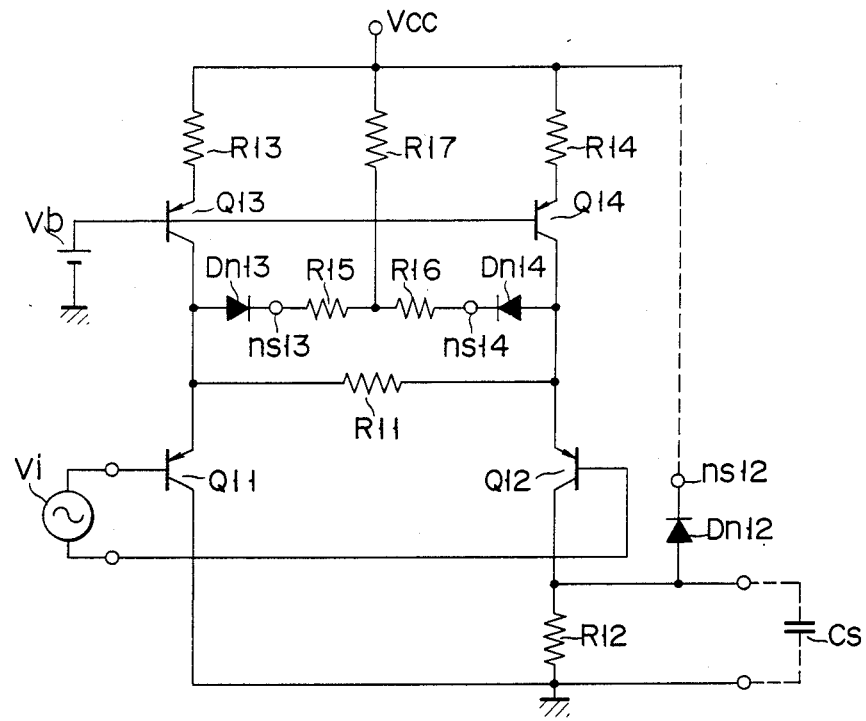
FIG. 3 shows a differential amplifier integrated circuit, according to an embodiment of the present invention, which uses vertical PNP transistors.

The gain $G(\omega)$ of the differential amplifier integrated circuit shown in FIG. 3 is expressed as follows:

$$G(\omega) = \frac{1 + j\omega C_j(Ra + \tfrac{1}{2}Re)}{1 + j\omega C_j Ra} \cdot \frac{1}{1 + j\omega(C_j + C_s)Rl} \cdot \frac{Rl}{Re} \tag{1}$$

where Re represents the resistance value of the resistors R11, Rl represents the resistance value of the load resistor R12, and $\omega$ represents an angular frequency of the input signal.

If the resistance values of Ra, Re and Rl are properly determined so that the differentiating time constant $C_j(Ra + Re/2)$ and integrating time constant $(C_j + C_s)Rl$ in equation (1) may be equal, that is to say, so that equation (2) or (3) holds, the gain $G(\omega)$ has only the integrating time constant $C_j Ra$ as shown in equation (4).

$$Cj(Ra + {\textstyle\frac{1}{2}}Re) = (Cj + Cs)Rl \quad (2)$$

$$Ra = \left(1 + \frac{Cs}{Cj}\right)Rl - {\textstyle\frac{1}{2}}Re \quad (3)$$

$$G(\omega) = \frac{1}{1 + j\omega CjRa} \cdot \frac{Rl}{Re} \quad (4)$$

The frequency characteristic of the gain $G(\omega)$ defined by equation (4) is flat and contains no ripple. Usually, $Cs << Cj$. Therefore, from equation (3), $Ra<Rl$. When comparing the present differential amplifier integrated circuit with the prior art one in respect to its integration time constant, $(Cj+Cs)Rl>CjRa$. For this reason, the frequency characteristic of the gain is improved with respect to the high frequency region, so that its flat frequency characteristic is extended. Incidentally, the resistance value of the resistor R17 is on the order of tens of kilo-ohms, while the resistance values of the resistors R11, R15 and R16 range from several hundreds of ohms to several kilo-ohms.

Figure 4:
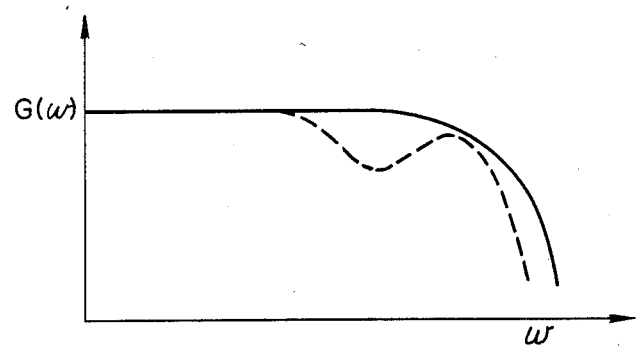
FIG. 4 shows a frequency characteristic of the circuit shown in FIG. 3.

In the differential amplifier integrated circuit of FIG. 3, a T-type resistor circuit is formed between the cathodes of the parasitic diodes Dn13 and Dn14 and the power source Vcc to match the differentiating time constant with the integrating time constant, so that the effect of the former upon the frequency characteristic is offset by the effect of the latter thereupon. As a result, as shown in FIG. 4, the flatness of the frequency characteristic is improved. Further, since the integrating time constant can be made small, the frequency characteristic of the gain in a high frequency region is improved. In the Figure, a broken line indicates the frequency characteristic of a prior art differential amplifier circuit as shown in FIG. 2.

Figure 5:
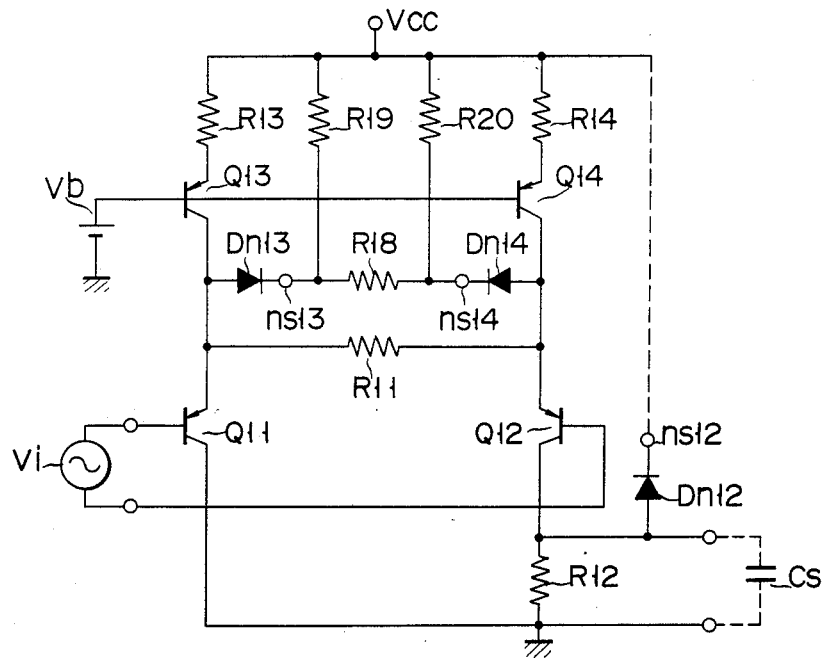
FIGS. 5 and 6 show modifications of the present invention, respectively.

FIG. 5 shows a modification of the present invention, in which a $\pi$-type resistor circuit having resistors R18, R19 and R20 is used in place of the T-type resistor circuit of FIG. 3. In this modification, if the resistance value Rb of the resistor R18 has a value which is substantially twice as great as the resistance value Ra shown in equation (2) and the resistors R19 and R20 are set, respectively, at a resistance value sufficiently greater than the resistance value Rb, then the same advantage as the circuit of FIG. 3 will be obtained.

Figure 6:
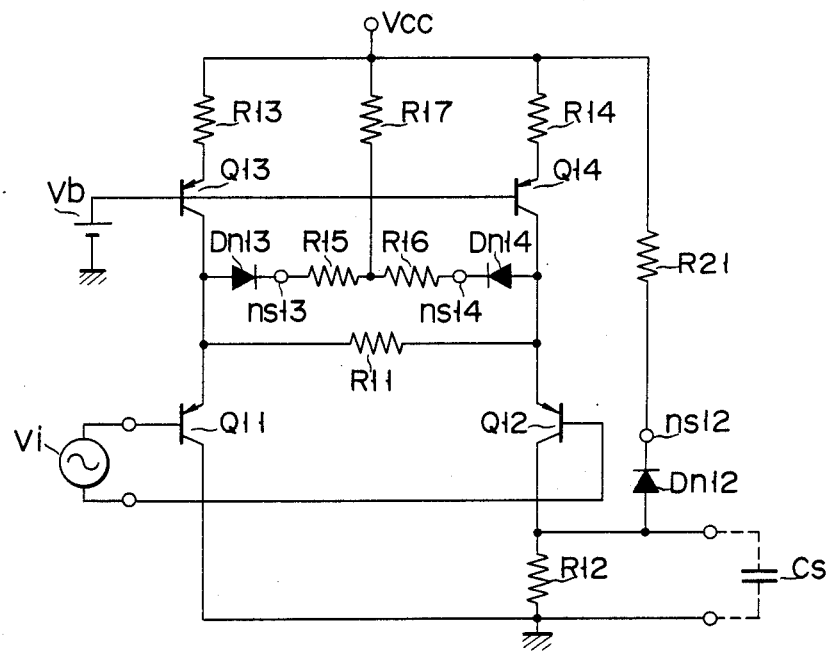

In the foregoing embodiments, the differential amplifier integrated circuit is constructed such that its differentiating time constant is so adjusted as to become substantially equal to the integrating time constant. However, the flexibility of the circuit design would be more increased by adjusting the integrating time constant. For example, as shown in FIG. 6, a resistor R21 is connected between the cathode ns12 of the parasitic diode Dn12 associated with the collector of the transistor Q12, and the power source Vcc. In this case, if the resistor R21 has a resistance value Rc sufficiently greater than the resistance value Rl of the load resistor R12, in the integrating time constant the junction capacitance Cj of the parasitic diode Dn12 will become ignorable. Therefore, equation (3) can be rewritten as follows.

$$Ra=(Cs/Cj)Rl-{\textstyle\frac{1}{2}}Re \quad (5)$$

where $Rc>>Rl$.

In the foregoing description, the invention has been explained by using the differential amplifier circuit as an example. However, the teachings of the present invention can also be applied to amplifier circuits using vertical PNP transistors than the differential amplifier circuit. For instance, the invention is also applicable to an amplifier circuit which is often used in the field of semiconductor integrated circuits and has an amplifying transistor (which corresponds to the transistor Q12 in the preceding embodiments) and a constant current source transistor (which corresponds to the transistor Q14 in the preceding embodiments) which are connected in series across the power source Vcc in the forward direction. If, in such an amplifier circuit, the differentiating time constant of a differentiating circuit formed on the collector side of the constant current source transistor is brought into match with the integrating time constant of an integrating circuit formed on the collector side of the amplifying transistor, then the frequency characteristic of the gain will be improved as in the preceding embodiment. The invention is also applicable to an amplifier circuit, which consists essentially of an amplifying transistor (which corresponds to the transistor Q12 in the preceding embodiment) and a load resistor (which corresponds to the resistor R12 in the preceding embodiment). In this amplifier circuit, as shown in FIG. 6, a direct current transmission element, such as the resistor R21, whose impedance is sufficiently higher than that of the load resistor, is connected between the cathode of a parasitic diode (which corresponds to the parasitic diode Dn12 in the preceding embodiments) coupled to the collector of the amplifying transistor, and a power source, whereby the junction capacitance of that parasitic diode can be ignored. Consequently, it is possible to prevent the deterioration of the frequency characteristic of the circuit in a high frequency region. In case of an amplifier circuit which deals with a very high frequency, an inductance element may be used as a high impedance d.c. transmission element.

What is claimed is:

1. A semiconductor integrated circuit comprising a vertical PNP transistor having a collector, an emitter, and a base in which said transistor has its emitter coupled to a power source and its collector coupled to a load resistance and its base connected to receive an input signal, and a parasitic diode has its anode coupled to the collector of said transistor and its cathode coupled to said power source, characterized in that a direct-current transmission element having an impedance which is appreciably higher than the resistance value of said load resistor is connected between the cathode of said parasitic diode and said power source.

2. The semiconductor integrated circuit according to claim 1, wherein said direct-current transmission element is a resistor.

3. A semiconductor integrated circuit comprising first and second vertical PNP transistors each having a collector, an emitter, and a base and in which said transistors have their emitter-collector paths connected in series across a power source in the forward direction, said first transistor has its base coupled to a d.c. voltage source, and said second transistor has its base coupled to an input signal source and its collector coupled to a load resistor, the collectors of said first and second transistors are respectively coupled with andes of parasitic diodes each having a junction capacitance with cathodes coupled together to said power source, characterized in that a resistor circuit, which forms a differentiating circuit together with said parasitic diode coupled to the collector of said first transistor, is connected between the collector of said first transistor and said power source, a differentiating time constant of said differentiating circuit being so adjusted as to become substantially equal to an integrating time constant of an integrating circuit including said load resistor and said parasitic diode coupled to said second transistor.

4. The semiconductor integrated circuit according to claim 3, wherein a direct-current transmission element having an impedance higher than the resistance value of said load resistor is connected between the cathode of said parasitic diode, coupled to said second transistor, and said power source.

5. The semiconductor integrated circuit according to claim 4, wherein said direct-current transmission element is a resistor.

6. A semiconductor integrated circuit comprising first, second, third, and fourth vertical PNP transistors each having a collector, an emitter, and a base in which said first and third transistors have their emitter-collector paths connected in series across a power source in the forward direction, said second and fourth transistors have their emitter-collector paths connected in series across said power source in the forward direction, said third and fourth transistors have their bases coupled to a d.c. voltage source, said first and second transistors have their bases coupled to an input signal source, said second transistor has its collector coupled to a load resistor, an emitter resistor is connected between the emmitters of said first and second transistors, the collectors of said second, third, and fourth transistors are respectively coupled with anodes of first, second and third parasitic diodes each having a junction capacitance, and cathodes of which are connected to said power source, characterized in that a resistor circuit is connected between the cathodes of said second and third parasitic diodes, and said power source, said resistor circuit forming a differentiating circuit together with said emitter resistor and said second and third parasitic diodes.

7. The semiconductor integrated circuit according to claim 6, wherein the differentiating time constant of said differentiating circuit is so set as to become substantially equal to the integrating time constant of an integrating circuit which includes said load resistor and said first parasitic diode coupled to the collector of said second transistor.

8. The semiconductor integrated circuit according to claim 6, wherein said transistor circuit includes first and second resistors, connected in series between the cathodes of said second and third parasitic diodes, and a third resistor, connected between said power source and a point of connection between said first and second resistors.

9. The semiconductor integrated circuit according to claim 8, wherein said first and second resistors have a substantially equal resistance value, and said third resistor has a resistance value which is appreciably higher than that of said first and second resistors.

10. The semiconductor integrated circuit according to claim 6, wherein said resistor circuit includes a first resistor, connected between the cathodes of said second and third parasitic diodes, and second and third resistors, connected between both ends of said first resistor and said power sources, respectively.

11. The semiconductor integrated circuit according to claim 10, wherein said second and third resistors have a substantially equal resistance value which is appreciably higher than that of said first resistor.

12. The semiconductor integrated circuit according to claim 6, wherein a direct-current transmission element having an impedance which is appreciably higher than the resistance value of said load resistor is connected between the cathode of said first parasitic diode, which has its anode coupled to the collector of said second transistor, and said power source.

13. The semiconductor integrated circuit according to claim 12, wherein said direct-current transmission element is a resistor.

* * * * *